United States Patent

Nakano et al.

[11] Patent Number: 5,846,451
[45] Date of Patent: Dec. 8, 1998

[54] CROSSLINKING TYPE LIQUID CRYSTAL POLYMER AND ORIENTED CROSSLINKING FILM THEREOF

[75] Inventors: Shusaku Nakano; Amane Mochizuki; Hironori Motomura; Kyoko Izumi, all of Osaka, Japan

[73] Assignee: Nitto Denko Corporation, Osaka, Japan

[21] Appl. No.: 756,787

[22] Filed: Nov. 26, 1996

[30] Foreign Application Priority Data

Dec. 7, 1995 [JP] Japan .................... 7-345912

[51] Int. Cl.$^6$ .......................... C09K 19/56; G02F 1/141; G03C 1/52; C08K 5/28
[52] U.S. Cl. .................. 252/299.01; 252/299.4; 252/299.68; 349/135; 428/1; 430/195; 524/192
[58] Field of Search .............. 252/299.01, 299.1, 252/299.4, 299.68; 430/195, 186; 349/167, 135; 428/1; 524/189, 190, 192

[56] References Cited

U.S. PATENT DOCUMENTS

| | | |
|---|---|---|
| 4,578,197 | 3/1986 | Kojima et al. .................... 430/196 |
| 5,038,166 | 8/1991 | Isaka et al. ........................ 355/27 |
| 5,424,368 | 6/1995 | Miyazaki et al. .................. 430/195 |

OTHER PUBLICATIONS

Ichimura et al., "Command Surface. Part 20. Fixation of Surface–assisted homogenous alignment of nematic liquid crystals by cationic photopolymerization", Macromol. Rapid. Commun. 17(8), 545–551, Aug. 1996.

*Primary Examiner*—Shean Wu
*Attorney, Agent, or Firm*—Sughrue, Mion, Zinn, Macpeak & Seas, PLC

[57] ABSTRACT

A crosslinking type liquid crystal polymer, an oriented crosslinking film thereof, and a method of producing the oriented crosslinking film are disclosed. The crosslinking type liquid crystal polymer comprises a liquid crystal polymer containing a polyfunctional azide compound represented by the following formula (A);

$$R^1-(N_3)_n \qquad (A)$$

wherein $R^1$ represents an organic group and n represents an integer of from 1 to 5.

18 Claims, No Drawings

CROSSLINKING TYPE LIQUID CRYSTAL POLYMER AND ORIENTED CROSSLINKING FILM THEREOF

FIELD OF THE INVENTION

The present invention relates to a crosslinking type liquid crystal polymer capable of forming an oriented crosslinking film such as an optical film having an excellent heat resistance, an oriented film produced from the crosslinking type liquid crystal polymer, and a method of producing the oriented crosslinking film.

BACKGROUND OF THE INVENTION

Various optical films each composed of an oriented film of a liquid crystal polymer have been proposed and the application thereof to a liquid crystal display, etc., has been expected. However, such an optical film is formed by coating a solution of a liquid crystal polymer on an orienting membrane followed by drying, heating the coating to a temperature higher than a glass transition temperature of the liquid crystal polymer, and cooling it. Therefore, there is a problem that since the heat resistance of the optical film relies on the glass transition temperature, the optical film is poor in the heat resistance.

That is, the oriented film forming the optical film maintains the oriented state at a temperature lower than an isotropic phase transition temperature where a stress does not act. However, where a stress acts, orientation is disordered and optical characteristics are changed at a temperature near the glass transition temperature. The stress in the oriented film occurs by a dimensional change, etc., caused by a temperature change, etc., under the use conditions in a practical embodiment as in the case of, for example, adhering the oriented film to a liquid crystal display apparatus, etc., together with a polarizing film and a retardation film via a pressure-sensitive adhesive layer. Thus, in a practical embodiment, the occurrence of stress is normal. For example, in the case of the dimensional change by the temperature change of a polarizing film, a shrinking stress occurs in the oriented film adhered to the polarizing film via the pressure-sensitive adhesive layer.

As a counterplan for improving the heat resistance of the oriented film, it may be considered to use a liquid crystal polymer having a high glass transition temperature. However, in this case, the temperature for forming the oriented film also becomes high and also the heat-resistant temperature required for the orienting membrane and the substrate supporting the membrane becomes high, giving disadvantages on restrictions for usable substrate and the economy. Further, where a fluid layer comprising a low molecular weight polymerizable liquid crystal compound is interposed between two substrates and subjected to a polymerization treatment by irradiation with ultraviolet rays, etc., to form an oriented film, the heat resistance of the oriented film can be improved. However, this case also induces the problem of poor production efficiency. In addition, in the method of polymerization treating a low molecular weight polymerizable liquid crystal compound by irradiation with ultraviolet rays, etc., there is a problem that an oriented film having a large area is hard to obtain.

SUMMARY OF THE INVENTION

Accordingly, an object of the present invention is to provide a liquid crystal polymer which can be applied to a coating system of the liquid crystal polymer solution, and thus can easily produce an oriented film having a large area with a good efficiency, and can form an oriented crosslinking film having an excellent heat resistance.

According to the present invention, there is provided a crosslinking type liquid crystal polymer comprising a liquid crystal polymer containing a polyfunctional azide compound represented by the following formula (A);

$$R^1-(N_3)_n \quad (A)$$

wherein $R_1$ represents an organic group and n represents an integer of from 1 to 5.

The crosslinking type liquid crystal polymer can be subjected to orientation treatment by the method of forming a solution of a liquid crystal polymer, coating the solution followed by drying, heating the coated liquid polymer to a temperature higher than the glass transition temperature of the liquid crystal polymer, and then cooling it. The heat resistance of the orientation-treated layer of the crosslinking type liquid crystal polymer can be improved by subjecting the orientation treated layer to a crosslinking treatment via the polyfunctional azide compound without causing the disturbance of the orientation. Accordingly, the crosslinking type liquid crystal polymer of the present invention can easily produce an oriented crosslinking film excellent in the heat resistance and having a large area with a good efficiency.

DETAILED DESCRIPTION OF THE INVENTION

The crosslinking type liquid crystal polymer of the present invention comprises the liquid polymer containing the polyfunctional azide compound represented by the following formula (A);

$$R^1-(N_3)_n \quad (A)$$

wherein $R^1$ represents an organic group and n represents an integer of from 1 to 5. The number of the azide group represented by n in the above formula is preferably from 2 to 4, and more preferably 2.

The polyfunctional azide compound used is appropriately selected from the compounds represented by the formula (A): $R^1-(N_3)_n$ (wherein $R^1$ represents an organic group and n represents an integer of from 1 to 5), and there is no particular restriction on the kind of the compound. Of those, the polyfunctional azide compound which does not disturb the orientation of the liquid crystal polymer is preferably used and the polyfunctional azide compound showing a liquid crystal property can also be preferably used. Further, from the points of the sensitivity at the crosslinking treatment, etc., an aromatic polyfunctional azide can be preferably used.

The aromatic polyfunctional azide having a good orientating property of liquid crystal polymer is, for example, a diazide having a skeletal structure such that the whole or a part of phenyl groups are bonded at the para-position, and preferably a diazide having a skeleton such structure that the diazide has two phenyl groups in the molecule and the two phenyl groups are bonded at the para-position. The diazide wherein the phenyl groups are bonded at the meta-position or the ortho-position may decrease the orientating property of the liquid polymer.

Examples of the above skeletal structures are diazides represented by the following chemical formulae. Of these diazides, the diazides having the skeletal structures represented by the formulae (f), (g), and (i) are preferred.

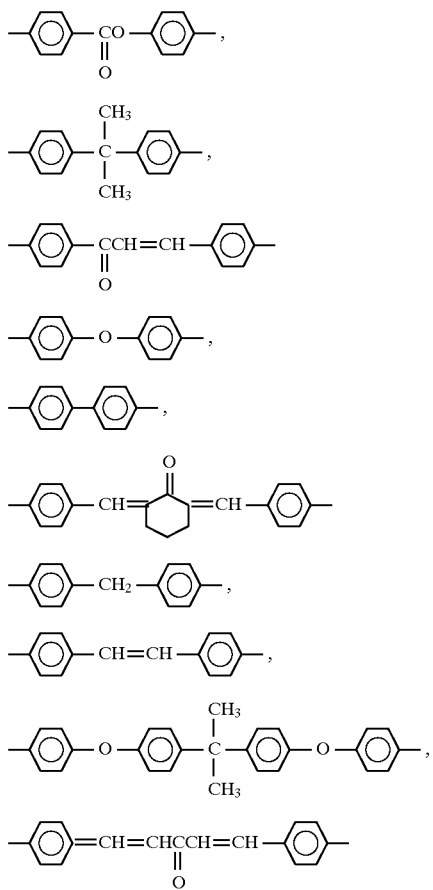

(a)
(b)
(c)
(d)
(e)
(f)
(g)
(h)
(i)
(j)

Examples of the aromatic polyfunctional azides are 2,6-di(p-azidobenzal)cyclohexanone, 2,6-di(p-azidobenzal)-4-methylcyclohexanone, 2,6-di(p-azidobenzal)-4-ethylcyclohexanone, 4,4'-diazidodiphenylmethane, 4,4'-diazido-2,2'-dimethoxybiphenyl, 2,2'-bis(4-azidophenoxyphenyl)propane, and 4,4'-diazidochalcone. Of these aromatic polyfunctional azides, 2,6-di(p-azidobenzal)cyclohexanone, 2,6-di(p-azidobenzal)-4-methylcyclohexanone, and 4,4,-diazidophenylmethane are preferably used.

The liquid crystal polymer which can be used is, for example, a liquid crystal polymer which is thermotropic and forms a monodomain by forming an oriented state such as a nematic orientation or a cholesteric orientation via an orienting membrane at the liquid crystal-forming temperature range. There is no particular restriction on the kind of the liquid crystal polymer, and an appropriate kind of the liquid crystal polymer can be used. Accordingly, various liquid polymers such as a main-chain type, or a side-chain type, wherein a mesogen comprising a para-substituted cyclic compound imparting a liquid crystal orienting property is introduced into the main chain or the side chain of the polymer, respectively, can be used.

Examples of the main-chain type liquid crystal polymer are a polyester polymer, a polyamide polymer, a polycarbonate polymer, and a polyester imide polymer, each having a structure of bonding a mesogen comprising a para-substituted cyclic compound via, if necessary, a spacer portion imparting a bending property. Examples of the side-chain type liquid crystal polymer are polymers each having polyacrylate, polymethacrylate, polysiloxane, polymalonate, etc., as the main-chain skeleton and having a mesogen comprising a para-substituted cyclic compound as the side chain via, if necessary, a spacer portion.

Examples of the para-substituted cyclic compound imparting a nematic orienting property are compounds having a para-substituted aromatic unit, a para-substituted cyclohexyl ring unit, etc., such as an azomethine type unit, an azo type unit, an azoxy type unit, an ester type unit, a biphenyl type unit, a phenylcyclohexane type unit, or a bicyclohexane type unit. The terminal substituent at the para-position in the para-substituted cyclic compound may be an appropriate group such as a cyano group, an alkyl group, or an alkoxy group.

The spacer portion is, for example, a polymethylene chain: $—(CH_2)_n—$, or a polyoxymethylene chain: $—(CH_2CH_2O)_m—$, each showing a bending property. The repeating number of the structural units forming the spacer potion is appropriately determined by, for example, the chemical structure of the mesogen portion. However, in general, when the spacer portion is the polymethylene chain, n is from 0 to 20, and preferably from 2 to 12, and when it is the polyoxymethylene chain, m is from 0 to 10, and preferably from 1 to 3.

On the other hand, the crystal liquid polymer of the cholesteric orientation type can be obtained by a method of introducing a chiral component into, for example, the liquid crystal polymer of the nematic orientation type described above. The chiral component used is a chiral component having asymmetric carbon atoms, and the examples thereof are those represented by the following chemical formulae. In the formulae, the carbon atom added by * means an optically active carbon atom.

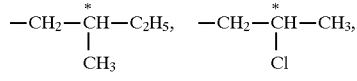

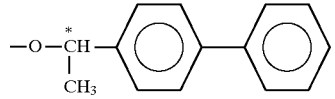

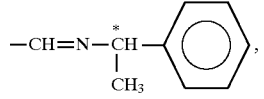

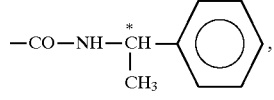

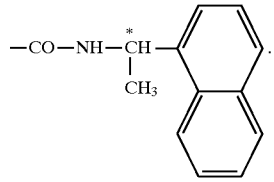

The preparation of the main-chain type liquid crystal polymer can be carried out by an appropriate method in accordance with an ordinary polymer synthesis such as a method of copolymerizing component monomers. Further, the preparation of the side-chain type liquid crystal polymer can be carried out by an appropriate method such as a monomer addition polymerization method of polymerizing a monomer formed by introducing a mesogen group into a vinyl main-chain-forming monomer such as an acrylic acid ester or a methacrylic acid ester via, if necessary, a spacer group by, for example, a radical polymerization method; a method of addition reacting a vinyl-substituted mesogen monomer in the presence of a platinum catalyst via an Si—H bond of polyoxymethylsilylene; a method of introducing a mesogen group by an esterification reaction using a phase-transfer catalyst via a functional group added to the main-chain polymer; or a method of subjecting a monomer formed by introducing a mesogen group into a part of malonic acid via, if necessary, a spacer group, and a diol to a polycondensation reaction.

In the present invention, in preparing the main-chain type or side-chain type liquid crystal polymer, a liquid crystal polymer having a crosslinking group in the molecule can be obtained by copolymerizing with the crosslinking group-containing monomer. By incorporating the crosslinking group into the liquid crystal polymer, the glass transition temperature, and therefore the orientation treatment temperature, can be lowered and also the liquid crystal polymer can be crosslinked by the azide via the crosslinking group to greatly improve the heat resistance thereof.

The crosslinking group-containing monomer which is preferably used is, for example, a monomer having a group participating in the polymerization and the crosslinking group at both terminals thereof. The main-chain type liquid crystal polymer can be obtained by copolymerizing the above monomer. The side-chain type liquid crystal polymer can be obtained by copolymerizing a liquid crystal monomer having a group participating in the polymerization and the crosslinking group-containing monomer.

There is no particular restriction on the mesogen in the liquid crystal monomer and there are, for example, the following mesogens.

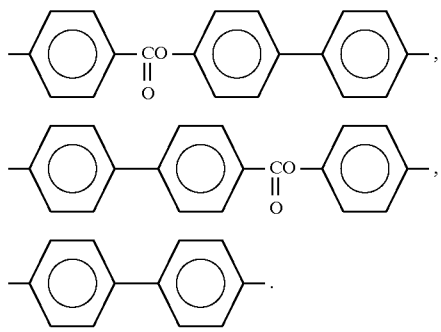

The number of the methylene units forming the spacer portion for connecting the main-chain skeleton and the mesogen is from 0 to 12, and preferably from 2 to 6. The terminal group is preferably a cyano group, a methoxy group, or the like. The cholesteric orienting property can be rendered by the introduction of a chiral component having an asymmetric carbon atom into the terminal.

The crosslinking group-containing monomer in preparing the side-chain type liquid crystal polymer is preferably a monomer which shows the liquid crystal property or does not disturb the liquid crystal property. Examples of the skeleton structure of the crosslinking group-containing monomer are those represented by the following formulae (m) to (q) in addition to those represented by the formulae (a), (c), (d), (e), (f), (g), (h), (j), and (k) described above for the aromatic polyfunctional azides and the mesogen in the liquid crystal monomer. Of those, the monomers represented by the formulae (a), (e), and (k) are preferred.

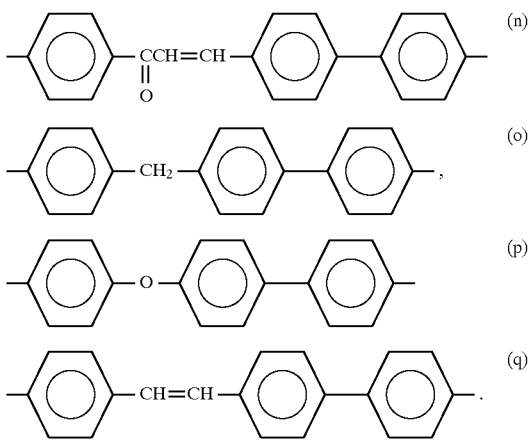

The crosslinking group in the crosslinking group-containing monomer is preferably unsaturated hydrocarbon linkages such as a cyclohexene ring, or an acrylic group. Of those, the cyclohexene ring is more preferred from the points of the ease of synthesis and the stability at the polymerization of the monomer.

In the present invention, the preferred liquid crystal polymer containing the crosslinking group is the liquid crystal polymer containing the copolymer component represented by the following formula (B);

wherein $R^2$ and $R^3$ each represent a hydrogen atom or a methyl group and $R^4$ represents an organic group.

The number of the methylene units forming the spacer portion connecting the side chain having the crosslinking group to the main-chain skeleton is from 0 to 12, and preferably from 2 to 6. The copolymerization proportion of the crosslinking group-containing monomer to the liquid crystal monomer is 50 mole % or less, preferably 40 mole % or less, and more preferably 30 mole % or less, from the point of preventing decrease of the liquid crystal property, etc.

The liquid crystal polymer used in the present invention has a weight average molecular weight of from 2,000 to 100,000, preferably from 2,200 to 80,000, and more preferably from 2,500 to 50,000, from the points of the film-forming property, the film strength, and the orienting property. In the liquid crystal polymer having the crosslinking group, when it is the main-chain type, the liquid crystal polymer having the crosslinking group at the main-chain terminal or in the main chain is preferred, and when it is the side-chain type, the liquid crystal polymer having the crosslinking group at the main-chain terminal, in the main chain, in the side chain, or at the side-chain terminal is preferred. Of those, the liquid crystal polymer having the crosslinking group at the side-chain terminal is more preferred.

The amount of polyfunctional azide compound used to the liquid crystal polymer is from 1 to 70 parts by weight, preferably from 5 to 50 parts by weight, and more preferably from 10 to 30 parts by weight, per 100 parts by weight of the liquid crystal polymer from the points of preventing occurrence of the insufficiency of the heat resistance (insufficiency of crosslinking) by using too small amount thereof and preventing occurrences of the precipitation of the azide compound, the reduction of the liquid crystal-forming temperature range of the liquid crystal polymer, the decrease of the orienting property, etc., by using the excessive amount thereof.

The preparation of the liquid crystal polymer containing the polyfunctional azide compound can be carried out by, for example, mixing a liquid crystal polymer and the polyfunctional azide compound using a solvent. An appropriate solvent which can dissolve the liquid crystal polymer and the polyfunctional azide compound can be used as the solvent, and there is no particular restriction on the solvent. Examples of the solvent are 1,1,2,2-tetrachloroethane, cyclohexanone, methylene chloride, and chloroform. Those can be used alone or as mixtures thereof.

The oriented crosslinking film of the present invention is an oriented crosslinking film comprising the crosslinking type liquid crystal polymer. The production of the oriented crosslinking film can be carried out by, for example, a method of casting a solution of the crosslinking type liquid crystal polymer containing the polyfunctional azide compound on an orientation-treatment surface followed by drying, heat-treating the dried layer formed to form an oriented layer, and subjecting the oriented layer to a crosslinking treatment.

The orientation-treatment surface which can be used is, for example, the conventional methods used for the orientation treatment of a low molecular weight liquid crystal compound. Examples thereof are a thin film of polyimide, polyvinyl alcohol, etc., on a glass plate, a polymer sheet, etc., on the surface of which is rubbing-treated; a thin film obtained by obliquely vapor depositing silicon oxide, etc., on a glass plate, a polymer sheet, etc., and a stretched film.

Casting the solution of the crosslinking type liquid crystal polymer containing the polyfunctional azide compound can be carried out by, for example, a method of casting the solution in the form of a thin layer using an appropriate method such as a spin coating method, a roll coating method, a flow coating method, a printing method, a dip coating method, or a casting film-forming method, and removing the solvent by drying the thin layer thus formed. The casting can also be carried out without using a solvent by, for example, a method of heat-melting the dried material of the solution in the state of showing an isotropic phase, and casting the molten material in a thin layer while maintaining its temperature.

The heat treatment for orienting the cast layer of the crosslinking type liquid crystal polymer containing the polyfunctional azide compound can be carried out by heating the cast layer to a temperature range of from the glass transition point of the liquid crystal polymer to the molten state showing the isotropic phase. In addition, there is no particular restriction on the cooling condition for fixing the oriented state. The heat treatment can be carried out at a temperature of 300° C. or lower. Therefore, a natural cooling method is generally employed.

The cast layer thus orientation-treated is subjected to a crosslinking treatment to form an oriented crosslinked layer. The crosslinking treatment can be carried out by one or both of a light-irradiation and heating. For the light-irradiation, an appropriate radiation such as ultraviolet rays, or electron rays can be used. In particular, ultraviolet rays which are difficult to modify the liquid crystal polymer is preferred, and the ultraviolet rays having a wavelength by which absorption of the liquid crystal polymer is small and the azide group is liable to be decomposed, particularly a wavelength of from 200 to 400 nm, are preferred.

It is preferred that the light irradiation is carried out under a reduced pressure for avoiding the influences by the oxygen obstruction. In addition, the heating temperature in the heat treatment can appropriately be determined according to, for example, the decomposition temperature of the azide group.

The oriented crosslinking film of the present invention may have an appropriate form such as a form of a proper film substrate having thereon the liquid crystal polymer layer which was subjected to the crosslinking treatment after orientation or a film form comprising a single layer of the liquid crystal polymer layer subjected to the crosslinking treatment after orientation. The oriented crosslinking film comprising the single layer of the liquid crystal polymer can be obtained as a peeled film from the orienting treatment surface. For recovering the oriented crosslinking film by peeling, an appropriate method can be employed according to the need, such as a method of forming the orienting treated surface using a polymer having a releasing side chain composed of a long-chain alkyl group; or a method of forming the orienting treatment surface on a glass plate the surface of which is modified by bonding a silane compound having an alkyl chain of from 8 to 18 carbon atoms.

On the other hand, when forming the oriented crosslinking film comprising a laminated material with a film substrate, a plastic film, a glass plate, a stretched film such as a retardation film, or an optical film such as a polarizing film, is used as the film substrate. The plastic film which can be used is, for example, a film comprising an optically transparent plastic, which may form a stretched film. Examples of the plastic are polymethyl methacrylate, polycarbonate, polyvinyl alcohol, polyarylate, polypropylene, polyolefin, and polystyrene. In particular, a plastic film showing small birefringence, such as a triacetyl cellulose film, is preferred.

The thickness of the liquid crystal polymer layer subjected to the orientation crosslinking treatment can appropriately be determined by the optical characteristics according to the purpose of use. The thickness is generally 100 μm or less, preferably 50 μm or less, and more preferably from 1 to 30 μm.

The present invention is described in more detail by reference to the following examples, but it should be understood that the invention is not construed as being limited thereto.

EXAMPLE 1

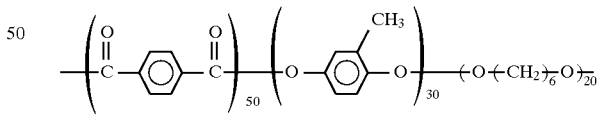

A main-chain type nematic liquid crystal polymer having the above structure (weight average molecular weight: 6,000, glass transition temperature: 90° C., and isotropic phase transition temperature: 280° C.) was dissolved in 1,1,2,2-tetrachloroethane to form a 15 wt % liquid crystal polymer solution. 2,6-Di(p-azidobenzal)cyclohexanone was added to the solution in an amount of 20% by weight based on the weight of the liquid crystal polymer. The-resulting solution was coated on an orientation-treating surface of a 50 μm thick triacetyl cellulose film followed by drying. The coated and dried layer thus formed was subjected to orientation treatment by heating at 160° C. for 5 minutes, cooled by allowing to stand at room temperature, and then irradiated with a light having a wavelength of 365 nm at 200 mJ/cm² to obtain an oriented film subjected to the orientation crosslinking treatment. The orientation-treating surface was formed by forming a polyvinyl alcohol layer having a thickness of about 0.1 μm on the triacetyl cellulose film and then subjecting the layer to a rubbing treatment with a rayon cloth.

EXAMPLE 2

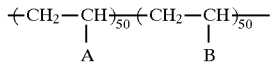

wherein A and B are as follows:

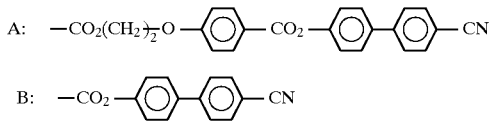

A side-chain type nematic liquid crystal polymer having the above structure (weight average molecular weight: 7,000, glass transition temperature: 85° C., and isotropic phase transition temperature: 270° C.) was dissolved in cyclohexanone to form a 20 wt % liquid crystal polymer solution. 2,6-Di(p-azidobenzal)cyclohexanone was added to the solution in an amount of 15% by weight based on the weight of the liquid crystal polymer.

The same procedure as in Example 1 was then followed except that the solution prepared above was used and the orientation treatment condition was changed to 155° C. and 5 minutes, to obtain an oriented film subjected to an orientation crosslinking treatment.

EXAMPLE 3

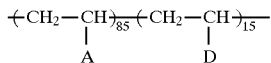

wherein A has the same meaning as defined above and D is as follows.

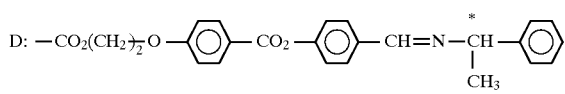

A side-chain type cholesteric liquid crystal polymer having the above structure (weight average molecular weight: 7,000, glass transition temperature: 80° C., and isotropic phase transition temperature: 240° C.) was dissolved in 1,1,2,2-tetrachloroethane to form a 20 wt % liquid crystal polymer solution. 2,6-Di(p-azidobenzal)-4-methylcyclohexanone was added to the solution in an amount of 20% by weight based on the weight of the liquid crystal polymer.

The same procedure as in Example 1 was then followed except that the solution prepared above was used and the orientation treatment condition was changed to 155° C. and 5 minutes, to obtain an oriented film subjected to an orientation crosslinking treatment.

EXAMPLE 4

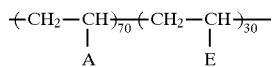

wherein A has the same meaning as defined above and E is as follows.

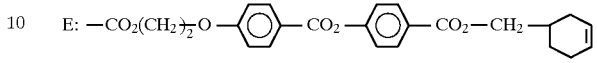

A side-chain type nematic liquid crystal polymer having a cyclohexene ring and having the above structure (weight average molecular weight: 6,500, glass transition temperature: 60° C., and isotropic phase transition temperature: 220° C.) was dissolved in cyclohexanone to form a 20 wt % liquid crystal polymer solution. 2,6-Di(p-azidobenzal)-4-methylcyclohexanone was added to the solution in an amount of 20% by weight based on the weight of the liquid crystal polymer.

The same procedure as in Example 1 was then followed except that the solution prepared above was used and the orientation treatment condition was changed to 120° C. and 5 minutes, to obtain an oriented film subjected to an orientation crosslinking treatment.

EXAMPLE 5

The same liquid crystal polymer as used in Example 4 was dissolved in 1,1,2,2-tetrachloroethane to form a 15 wt % liquid crystal polymer. 4,4'-Diazidophenylmethane was added to the solution in an amount of 20% by weight based on the weight of the liquid crystal polymer.

The same procedure as in Example 4 was then followed except that the solution prepared above was used, the orientation treatment condition was changed to 120° C. and 5 minutes, and the crosslinking treatment was carried out by irradiating a light having a wavelength of 230 nm at 200 mJ/cm², to obtain an oriented film subjected to an orientating crosslinking treatment.

EXAMPLE 6

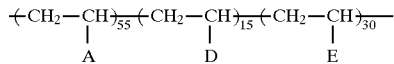

wherein A, D, and E have the same meanings as defined above.

A side-chain type cholesteric liquid crystal polymer having a cyclohexene ring and having the above structure (weight average molecular weight: 6,500, glass transition temperature: 65° C., and isotropic phase transition temperature: 215° C.) was dissolved in cyclohexanone to form a 20 wt % liquid crystal polymer solution. 2,6-Di(p-azidobenzal)-4-methylcyclohexanone was added to the solution in an amount of 20% by weight based on the weight of the liquid crystal polymer.

The same procedure as in Example 1 was then followed except that the solution thus obtained was used and the orientation treatment condition was changed to 120° C. and 5 minutes, to obtain an oriented film subjected to an orientation crosslinking treatment.

Comparative Example 1

The same procedure as in Example 1 was followed except that 2,6-di(p-azidobenzal)cyclohexanone was not added and the crosslinking treatment by the ultraviolet rays was not applied, to obtain an oriented film.

Comparative Example 2

The same procedure as in Example 2 was followed except that 2,6-di(p-azidobenzal)cyclohexanone was not added and the crosslinking treatment by the ultraviolet rays was not applied, to obtain an oriented film.

Comparative Example 3

The same procedure as in Example 3 was followed except that 2,6-di(p-azidobenzal)cyclohexanone was not added and the crosslinking treatment by the ultraviolet rays was not applied, to obtain an oriented film.

Comparative Example 4

The same procedure as in Example 4 was followed except that 2,6-di(p-azidobenzal)cyclohexanone was not added and the crosslinking treatment by the ultraviolet rays was not applied, to obtain an oriented film.

Comparative Example 5

The same procedure as in Example 5 was followed except that 2,6-di(p-azidobenzal)cyclohexanone was not added and the crosslinking treatment by the ultraviolet rays was not applied, to obtain an oriented film.

EVALUATION TEST

Each of the oriented films obtained in the examples and the comparative examples described above was adhered to a polarizing film (G1220DU, trade name, made by NITTO DENKO CORPORATION) via an acrylic pressure-sensitive adhesive layer having a thickness of 20 μm. After heating each assembly formed at various temperatures for one hour, the change of the appearance was visually observed. The highest temperature at which no change was observed was evaluated as the heat-resistant temperature.

The results obtained are shown in the Table below.

|  | Heat-Resistant Temperature (°C.) |
|---|---|
| Example 1 | 120 |
| Example 2 | 110 |
| Example 3 | 100 |
| Example 4 | 110 |
| Example 5 | 100 |
| Example 6 | 110 |
| Comparative Example 1 | 80 |
| Comparative Example 2 | 90 |
| Comparative Example 3 | 80 |
| Comparative Example 4 | 60 |
| Comparative Example 5 | 60 |

From the above table, it can be seen that the heat-resistant temperature is largely improved in the oriented crosslinking films of the examples of the present invention subjected to the crosslinking treatment. Further, in each of the orientation crosslinking treated products in the examples of the present invention, disturbance of the orientation by addition of the azide compound and by the crosslinking treatment was not observed and each of the orientation crosslinking treated products of the present invention showed substantially the same optical characteristics as those of the product to which the azide compound was not added and those of the non-crosslinking treated product.

While the invention has been described in detail and with reference to specific embodiments thereof, it will be apparent to one skilled in the art that various changes and modifications can be made therein without departing from the spirit and scope thereof.

What is claimed is:

1. A crosslinking type liquid crystal polymer comprising a liquid crystal polymer containing a polyfunctional azide compound represented by the following formula (A);

$$R^1-(N_3)_n \qquad (A)$$

wherein $R^1$ represents an organic group and n represents an integer of from 1 to 5.

2. The crosslinking type liquid crystal polymer of claim 1, wherein the polyfunctional azide compound is an aromatic polyfunctional azide having from 2 to 4 phenyl groups in the molecule, the whole or a part of said phenyl groups being bonded to the para-positions.

3. The crosslinking type liquid crystal polymer of claim 1, wherein the liquid crystal polymer has a crosslinking group in the molecule.

4. The crosslinking type liquid crystal polymer of claim 3, wherein the crosslinking group is an unsaturated hydrocarbon bond and is positioned at a side-chain terminal of the liquid crystal polymer.

5. The crosslinking type liquid crystal polymer of claim 4, wherein the liquid crystal polymer has an acrylic main-chain skeleton or a methacrylic main-chain skeleton.

6. The crosslinking type liquid crystal polymer of claim 5, wherein the liquid polymer contains a copolymerization component represented by the following formula (B);

wherein $R^2$ and $R^3$ each represent a hydrogen atom or a methyl group and $R^4$ represents an organic group.

7. An oriented crosslinking film comprising a crosslinking type liquid crystal polymer comprising a liquid crystal polymer containing a polyfunctional azide compound represented by the following formula (A);

$$R^1-(N_3)_n \qquad (A)$$

wherein $R^1$ represents an organic group and n represents an integer of from 1 to 5.

8. The oriented crosslinking film of claim 7, wherein the polyfunctional azide compound is an aromatic polyfunctional azide having from 2 to 4 phenyl groups in the molecule, the whole or a part of said phenyl groups being bonded to the para-positions.

9. The oriented crosslinking film of claim 7, wherein the liquid crystal polymer has a crosslinking-participation group in the molecule.

10. The oriented crosslinking film of claim 9, wherein the crosslinking-participation group is an unsaturated hydrocarbon bond and is positioned at a side-chain terminal of the liquid crystal polymer.

11. The oriented crosslinking film of claim 10, wherein the liquid crystal polymer has an acrylic main-chain skeleton or a methacrylic main-chain skeleton.

12. The oriented crosslinking film of claim 11, wherein the liquid polymer contains a copolymerization component represented by the following formula (B);

wherein $R^2$ and $R^3$ each represent a hydrogen atom or a methyl group and $R^4$ represents an organic group.

13. A method of producing an oriented crosslinking film, which comprises orienting a crosslinking type liquid crystal polymer comprising a liquid crystal polymer containing a polyfunctional azide compound represented by the following formula (A);

$$R^1\text{---}(N_3)_n \quad (A)$$

wherein $R^1$ represents an organic group and n represents an integer of from 1 to 5,
and crosslinking treating the oriented liquid crystal polymer with one or both of a light irradiation and heating.

14. The method of claim 13, wherein the polyfunctional azide compound is an aromatic polyfunctional azide having from 2 to 4 phenyl groups in the molecule, the whole or a part of said phenyl groups being bonded to the para-positions.

15. The method of claim 13, wherein the liquid crystal polymer has a crosslinking group in the molecule.

16. The method of claim 15, wherein the crosslinking group is an unsaturated hydrocarbon bond and is positioned at a side-chain terminal of the liquid crystal polymer.

17. The method of claim 16, wherein the liquid crystal polymer has an acrylic main-chain skeleton or a methacrylic main-chain skeleton.

18. The method of claim 17, wherein the liquid polymer contains a copolymerization component represented by the following formula (B);

wherein $R^2$ and $R^3$ each represent a hydrogen atom or a methyl group and $R^4$ represents an organic group.

* * * * *